United States Patent [19]

Kitsuta et al.

[11] Patent Number: 5,027,005

[45] Date of Patent: Jun. 25, 1991

[54] LOGIC CIRCUIT WHICH CAN BE SELECTED TO FUNCTION AS A D OR T TYPE FLIP-FLOP

[75] Inventors: Tatsuaki Kitsuta; Isao Shimotsuhama; Yoshio Watanabe; Masahiro Tanaka, all of Kawasaki; Shinichi Shiotsu, Hachioji; Kazumi Ogawa, Komaki, all of Japan

[73] Assignee: Fujitsu Limited, Kawasaki, Japan

[21] Appl. No.: 466,951

[22] Filed: Jan. 18, 1990

[30] Foreign Application Priority Data

Jan. 20, 1989 [JP] Japan .................................. 1-12404
Apr. 6, 1989 [JP] Japan .................................. 1-87284

[51] Int. Cl.⁵ .................... H03K 3/284; H03K 19/086
[52] U.S. Cl. ............................... 307/272.1; 307/455; 307/289
[58] Field of Search ................. 307/272.1, 272.2, 289, 307/290, 455

[56] References Cited

U.S. PATENT DOCUMENTS

| 3,510,787 | 5/1970 | Pound et al. | 307/272.1 |
| 3,609,569 | 9/1971 | Todd | 307/272.1 |
| 3,751,683 | 8/1973 | Drost | 307/272.1 |
| 4,525,641 | 6/1985 | Cruz et al. | 307/272.1 |

Primary Examiner—Stanley D. Miller
Assistant Examiner—Richard Roseen
Attorney, Agent, or Firm—Staas & Halsey

[57] ABSTRACT

A logic circuit comprises a first terminal for receiving an input data signal, a second terminal for receiving a clock signal, a first latch circuit coupled to the first and second terminals for latching the input data signal responsive to the clock signal, a second latch circuit coupled to the first latch circuit for latching an output signal of the first latch circuit, a third terminal for outputting an output data signal which is output from the second latch circuit, and a selecting part coupled to the third terminal for selectively feeding back the output data signal to the first latch circuit in a first mode and for cutting off the feedback of the output data signal to the first latch circuit in a second mode, where the logic circuit operates as a toggle flip-flop in the first mode and operates as a delay flip-flop in the second mode. The input data signal received by the first terminal selectively identifies one of the two modes of the flip-flop.

9 Claims, 15 Drawing Sheets

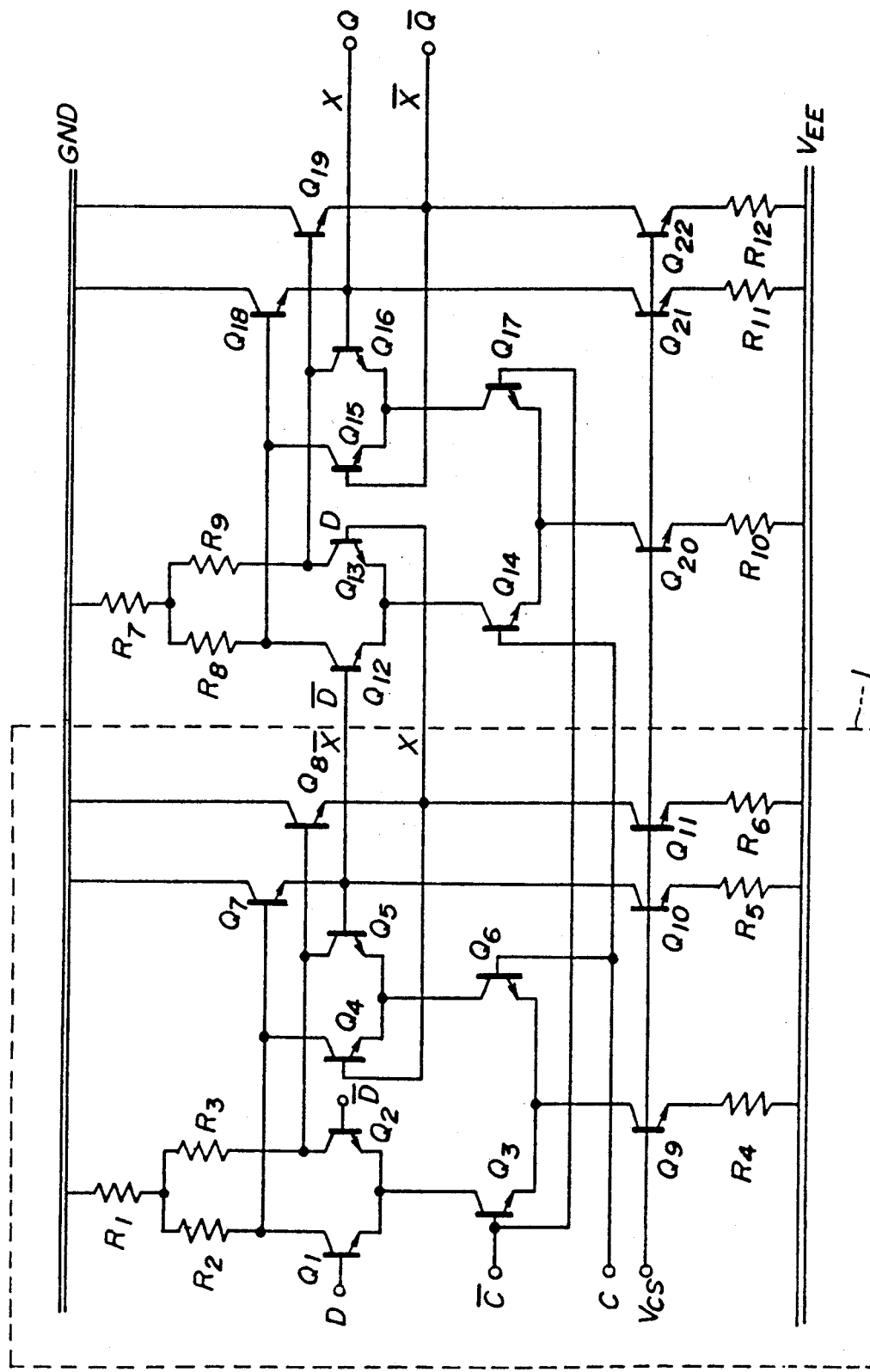
FIG. I PRIOR ART

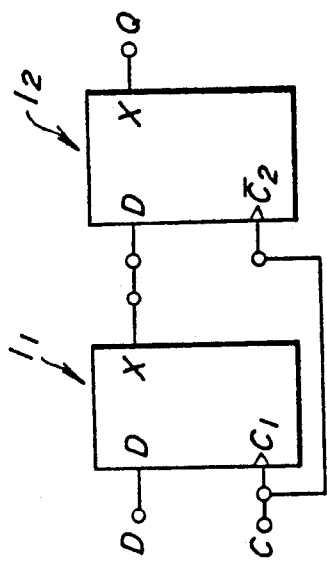
FIG. 3A PRIOR ART
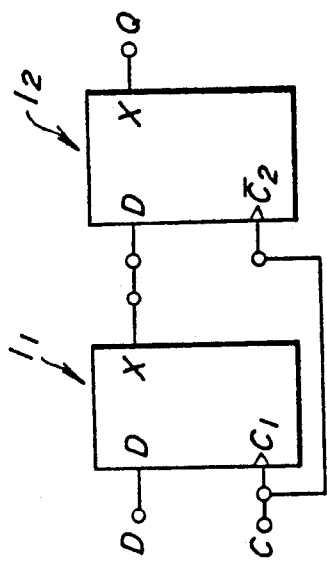
FIG. 3B PRIOR ART
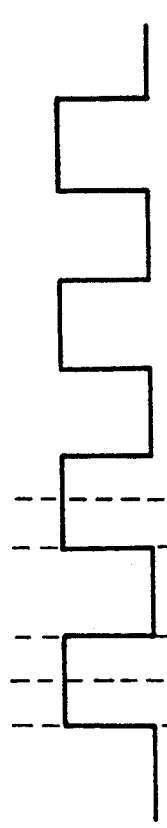
FIG. 4A PRIOR ART C
FIG. 4B PRIOR ART D
FIG. 4C PRIOR ART Q

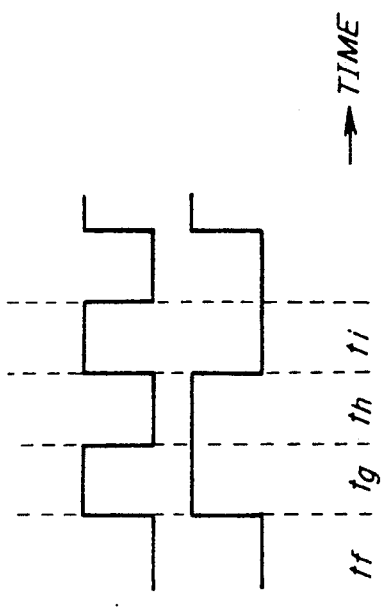
FIG. 7A PRIOR ART
FIG. 7B PRIOR ART
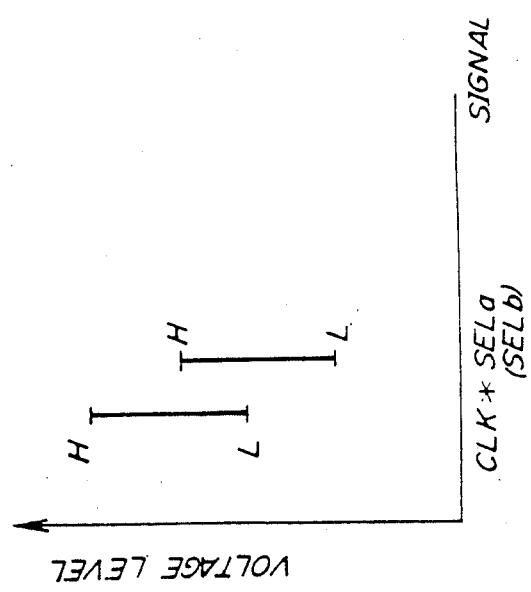
FIG. 17

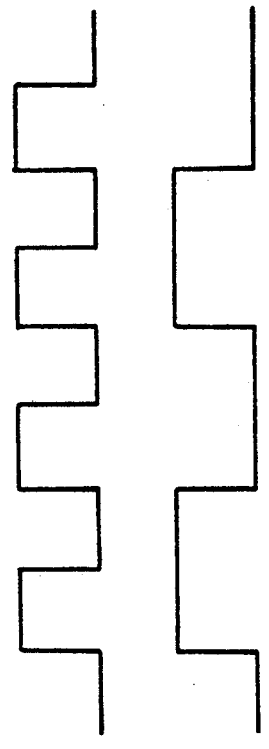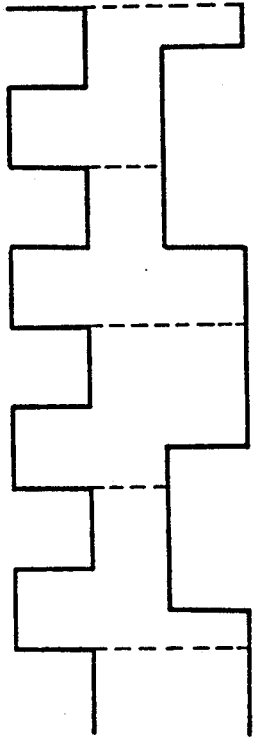

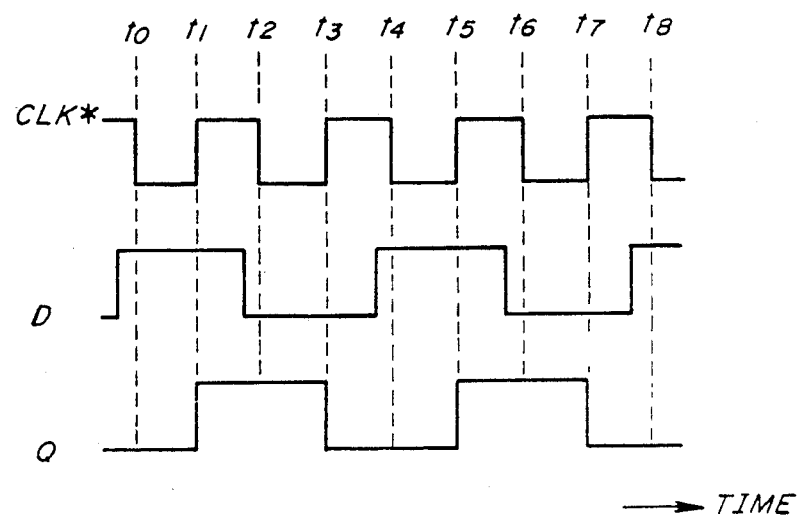
FIG. 18A CLK*
FIG. 18B D
FIG. 18C Q
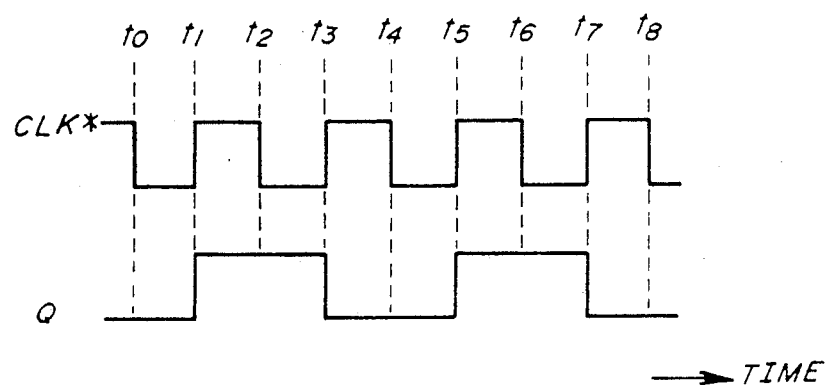
FIG. 19A CLK*
FIG. 19B Q

LOGIC CIRCUIT WHICH CAN BE SELECTED TO FUNCTION AS A D OR T TYPE FLIP-FLOP

BACKGROUND OF THE INVENTION

The present invention generally relates to logic circuits, and more particularly to a logic circuit which can selectively function as a toggle flip-flop or a delay flip-flop.

Every time an input signal is applied to a toggle flip-flop (hereinafter simply referred to as a T flip-flop), an output signal of the T flip-flop is inverted. On the other hand, a delay flip-flop (hereinafter simply referred to as a D flip-flop) holds and outputs an input data in synchronism with edges of a clock signal.

With the recent rapid progress in integrated circuits (ICs), the user's needs are expanding and there are demands for easy-to-use ICs in addition to the high integration density and high performance. As one conceivable method of satisfying such demands, it is possible to provide two functions in one IC.

A description will be given of a conventional D flip-flop and a conventional T flip-flop which employ the emitter-coupled logic (ECL).

FIG. 1 shows a circuit diagram of the conventional D flip-flop which employs the ECL with the so-called series gate and collector dot. The D flip-flop comprises transistors Q1 through Q22 and resistors R1 through R12. In FIG. 1, D denotes a data signal, C denotes a clock signal, $V_{CS}$ denotes a reference voltage, GND denotes a ground voltage of 0 V, and $V_{EE}$ denotes a power source voltage of −5.2 V.

FIGS. 2A and 2B respectively show a circuit portion 1 indicated by a phantom line in FIG. 1. FIGS. 2A and 2B respectively show a latch circuit, and the D flip-flop comprises two such latch circuits which are connected in series. A description will first be given of the operation of the latch circuit so as to facilitate the understanding of the D flip-flop.

In a first case where the data signal D has a high level and the clock signal C has a low level, the transistor Q1 turns ON and the transistor Q2 turns OFF. In addition, the transistor Q3 turns ON and the transistor Q6 turns OFF. Hence, a current flows through the resistor R2 as indicated by a solid arrow in FIG. 2A, and no current flows through the resistor R3. Accordingly, the level at a node A becomes low, and the level at a node B becomes high. Outputs X and $\overline{X}$ which are obtained via an emitter follower which comprises the transistors Q7 and Q8 respectively have a high level and a low level. The transistors Q9 through Q11 function as a current source.

In a second case where the data signal D has a low level and the clock signal C has a low level, the transistor Q1 turns OFF and the transistor Q2 turns ON. In addition, the transistor Q3 turns ON and the transistor Q6 turns OFF. Hence, a current flows through the resistor R3 as indicated by a phantom arrow in FIG. 2A, and no current flows through the resistor R2. Accordingly, the level at the node A is high and the level at the node B is low. The outputs X and $\overline{X}$ respectively have a low level and a high level. In other words, the data signal D is output as it is as the output X when the clock signal C has the low level.

In a third case where the data signal D has a high or low level and the clock signal C has a high level, the transistor Q3 turns OFF and the transistor Q6 turns ON. Hence, if the output X has a high level immediately before the clock signal C undergoes a transition from a low level to a high level, the transistor Q4 turns ON and the transistor Q5 turns OFF. As a result, a current flows through the resistor R2 as indicated by a solid arrow in FIG. 2B, and no current flow through the resistor R3. Accordingly, the level at the node A is low and the level at the node B is high. The outputs X and $\overline{X}$ respectively have a high level and a low level. On the other hand, if the output X has a low level immediately before the clock signal C undergoes a transition from a low level to a high level, the transistor Q4 turns OFF and the transistor Q5 turns ON. As a result, a current flows through the resistor R3 as indicated by a phantom arrow in FIG. 2B, and no current flows through the resistor R2. Accordingly, the outputs X and $\overline{X}$ respectively have a low level and a high level.

Therefore, when the clock signal C has a high level, the latch circuit holds an output state immediately before the clock signal C undergoes a transition from a low level to a high level (that is, performs a latch operation), regardless of the level of the input signal D. The following Table shows a truth table summarizing the operation of the latch circuit, where L denotes a low level, H denotes a high level and Q denotes an output level immediately before the clock signal C undergoes a transition from the low level to the high level. This designation is also used in the description hereafter.

TABLE

| Clock C | D | $\overline{D}$ | X | $\overline{X}$ |
|---|---|---|---|---|
| L | H | L | H | L |
| L | L | H | L | H |
| H | H | L | Q | Q |
| H | L | H | Q | Q |

FIG. 3A is a block diagram of the circuit portion 1, and FIG. 3B shows latch circuits $1_1$ and $1_2$ constituting the D flip-flop shown in FIG. 1.

Next, a description will be given of the operation of the D flip-flop, by referring to FIG. 3B. FIGS. 4(A) through 4(C) are timing charts for explaining the operation of the D flip-flop, and FIGS. 5A through 5E respectively show data flows at various time intervals ta through te shown in FIGS. 4(A) through 4(C).

During the time interval ta, C=L, D=L and Q=L as shown in FIG. 5A, where it is assumed that Q=L. In this case, the latch circuit $1_1$ outputs the incoming low-level data signal D as it is, and the latch circuit $1_2$ latches a previous data signal D (assuming Q=L).

During the time interval tb, C=H, D=L and Q=L as shown in FIG. 5B. That is, the latch circuit $1_1$ latches the low-level signal which is output during the time interval ta, and the latch circuit $1_2$ outputs the incoming low-level signal as it is.

During the time interval tc, C=H, D=H and Q=L as shown in FIG. 5C. In this case, because the latch circuit $1_1$ latches the low-level signal, the output of the latch circuit $1_1$ does not change even when a high-level data signal D is received. The latch circuit $1_2$ outputs the incoming low-level signal as it is.

During the time interval td, C=L, D=H and Q=L as shown in FIG. 5D. In other words, the latch circuit $1_1$ outputs the incoming high-level data signal D as it is, and the latch circuit $1_2$ latches the low-level signal which is output during the time interval tc.

During the time interval te, C=H, D=H and Q=H as shown in FIG. 5E. In this case, the latch circuit $1_1$ latches the high-level signal which is output during the time interval td. On the other hand, the latch circuit $1_2$ outputs the high-level signal which is received by the transition of the clock signal C, as it is.

Therefore, the D flip-flop latches the level of the data signal D when the clock signal C undergoes a transition from a low level to a high level, and this level is held and output until the clock signal C undergoes a next transition from the low level to the high level.

Next, a description will be given of an operation of the conventional T flip-flop. The T flip-flop comprises the latch circuits $1_1$ and $1_2$ which are connected in series, and a feedback path is provided as shown in FIG. 6 to feed back an output of the latch circuit $1_2$ to the latch circuit $1_1$ FIGS. 7(A) and 7(B) are timing charts for explaining the operation of the T flip-flop, and FIG. 8 shows a circuit structure of the T flip-flop. FIGS. 9A through 9D respectively show data flows at various time intervals tf through ti shown in FIGS. 7(A) and 7(B).

During the time interval tf, C=L and Q=L. In other words, the latch circuit $1_1$ outputs the incoming low-level signal as it is, and the latch circuit $1_2$ latches a low-level signal which is output during a previous time interval.

During the time interval tg, C=H and Q=H. In this case, the latch circuit $1_1$ latches the low-level signal which is output during the time interval tf, and the latch circuit $1_2$ functions as an inverter. The latch circuit $1_1$ receives as an input the output Q of the latch circuit $1_2$ which is fed back to the latch circuit $1_1$.

During the time interval th, C=L and Q=H. That is, the latch circuit $1_1$ outputs the incoming high-level signal as it is, and the latch circuit $1_2$ latches the high-level signal which is output during the time interval tg.

During the time interval ti, C=H and Q=L. In this case, the latch circuit $1_1$ latches the high level signal which is output during the time interval th, and the latch circuit $1_2$ functions as an inverter.

Therefore, the T flip-flop outputs a signal which has a period two times the period of the clock signal C in synchronism with the clock signal C. The output signal of the T flip-flop is inverted for every one period of the clock signal C.

However, in the conventional logic circuits which require the functions of the D flip-flop and the T flip-flop, two independent circuits must be designed and produced to realize the functions of the D flip-flop and the T flip-flop. For this reason, the integration density and functions of the logic circuit cannot be improved, and there are problems in that it is difficult to satisfy the user's various demands and to reduce the cost of the logic circuit.

The above described problems are notable especially when D flip-flops and T flip-flops coexist within the logic circuit and the D flip-flop of the logic circuit is changed to the T flip-flop or vice versa. In this case, the mask pattern of the logic circuit must be redesigned in accordance with the change of flip-flops used, and the design and production processes must be carried out again. As a result, the development cost of the logic circuit becomes expensive, and a long time is required to develop one logic circuit to meet the user's demands. In other words, once the logic circuit is produced, the user cannot freely change the arrangement of the flip-flops within the logic circuit, and the entire logic circuit must be redesigned in order to change the arrangement of the flip-flops within the logic circuit.

SUMMARY OF THE INVENTION

Accordingly, it is a general object of the present invention to provide a novel and useful logic circuit in which the problems described above are eliminated.

Another and more specific object of the present invention is to provide a logic circuit which comprises a circuit which can selectively function as a D flip-flop and a T flip-flop. According to the logic circuit of the present invention, it is possible to improve the integration density and performance of the logic circuit which is produced in the form of an IC, and the logic circuit can satisfy the user's various needs without increasing the development and production costs.

Still another object of the present invention is to provide a logic circuit comprising first terminal means for receiving an input data signal, second terminal means for receiving a clock signal, first latch means coupled to the first and second terminal means for latching the input data signal responsive to the clock signal, second latch means coupled to the first latch means for latching an output signal of the first latch means, third terminals means for outputting an output data signal which is output from the second latch means; and selecting means coupled to the third terminal means for selectively feeding back the output data signal to the first latch means in a first mode and for cutting off the feedback of the output data signal to the first latch means in a second mode, where the logic circuit operates as a toggle flip-flop in the first mode and operates as a delay flip-flop in the second mode. According to the logic circuit of the present invention, it is possible to improve the integration density and performance of the logic circuit which is produced in the form of an IC, and the logic circuit can satisfy the user's various needs without increasing the development and production costs.

Other objects and further features of the present invention will be apparent from the following detailed description when read in conjunction with the accompanying drawings.

BRIEF DESCRIPTION OF THE DRAWINGS

FIG. 1 is a circuit diagram showing a conventional D flip-flop;

FIG. 3A is a block diagram showing a circuit portion of the D flip-flop;

FIG. 3B is a block diagram showing two latch circuits constituting the D flip-flop;

FIGS. 4(A) through 4(C) are timing charts for explaining the operation of the D flip-flop;

FIGS. 7(A) through 7(B) are timing charts for explaining the operation of the T flip-flop;

FIGS. 14(A), 14(B) and 15(A) through 15(C) are timing charts for explaining the operation of the first embodiment;

FIG. 17 is a diagram showing relationships of signals levels in the logic circuit shown in FIG. 16; and FIGS. 18(A) through 18(C), 19(A) and 19(B) are timing charts for explaining the operation of the second embodiment.

DESCRIPTION OF THE PREFERRED EMBODIMENTS

First, a description will be given of the operating principle of a first embodiment of a logic circuit according to the present invention, by referring to FIGS. 10 and 11.

Figure 10:
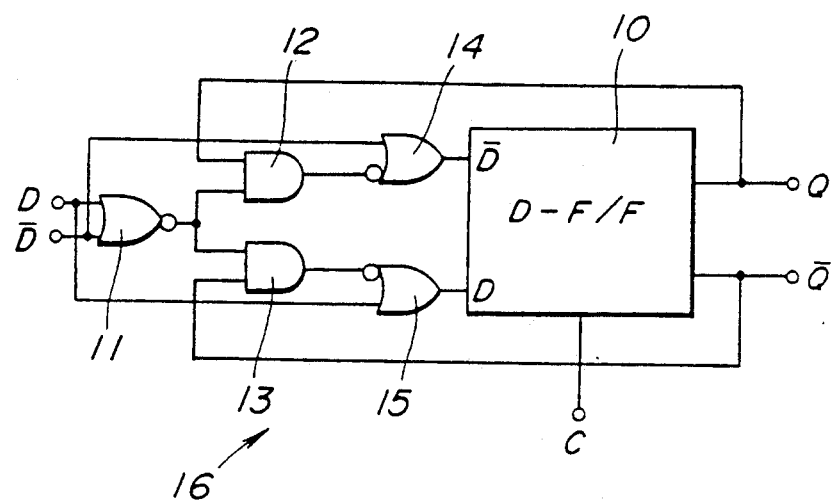
FIG. 10 is a block diagram illustrating a first embodiment of a logic circuit according to the present invention.

FIG. 10 shows the first embodiment of the logic circuit. In FIG. 10, the logic circuit comprises a D flip-flop 10, a NOR gate 11, AND gates 12 and 13, and OR gates 14 and 15. Both of the OR gates 14 and 15 have one inverting input terminal. Input data signals D and $\overline{D}$ are supplied to the NOR gate 11, and output signals Q and $\overline{Q}$ are output from the D flip-flop 10 and fed back to the AND gates 12 and 13. The levels of the signals D, $\overline{D}$, Q and $\overline{Q}$ are set as shown in FIG. 11. In other words, the binary level of the input data signals D and $\overline{D}$ are set higher than the binary level of the output signals Q and $\overline{Q}$, but the binary levels have a common range. In addition, when the input data terminals D and $\overline{D}$ are open-circuited, that is, no input data signals D and $\overline{D}$ are applied to the NOR gate 11, the level at the input terminals of the NOR gate 11 falls to the so-called most negative level. In this case, the most negative level is the power source voltage $V_{EE}$ which is $-5.2$ V, for example.

The binary level range of the input data signal D and $\overline{D}$ can be adjusted with ease by making a level shift in a circuit (not shown) which is connected at a stage preceding the logic circuit shown in FIG. 10 by use of resistors, for example.

Figure 13:
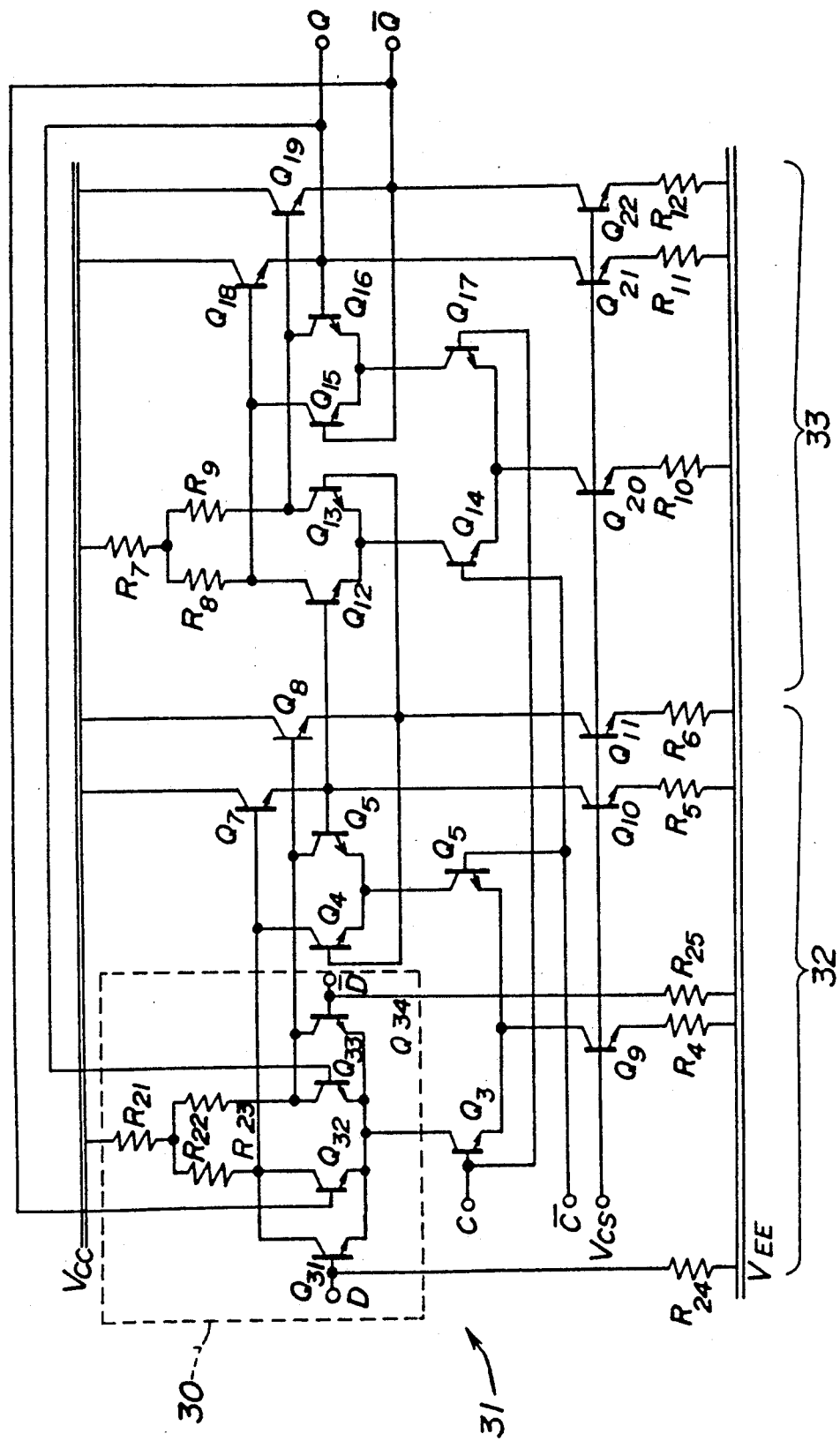
FIG. 13 is a circuit diagram of the first embodiment.

The NOR gate 11, the AND gates 12 and 13 and the OR gates 14 and 15 as a whole operate as a function selection means 16. In FIG. 10, the function selection means 16 is provided at a stage preceding the D flip-flop 10 for the sake of convenience, but the circuit structure of the function selection means 16 is simple and can be assembled within the ECL gates of the logic circuit as shown in FIG. 13 which will be described later.

Figure 12A:
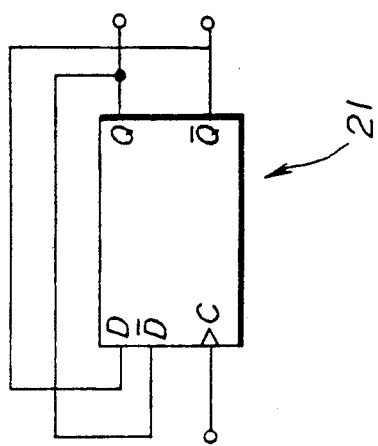
FIG. 12A is a block diagram showing a T flip-flop which is realized by the first embodiment.

When the input data terminals D and $\overline{D}$ are open-circuited, $D=\overline{D}=V_{EE}$, the NOR gate 11 outputs a high-level signal. Hence, the AND gates 12 and 13 open and pass the output signals Q and $\overline{Q}$ which are fed back from the D flip-flop. When the input data terminals D and $\overline{D}$ are not open-circuited, one of the input data signals D and $\overline{D}$ has a high level, and the AND gates 12 and 13 are closed because the NOR gate 11 outputs a low-level signal. In the open-circuited condition, the signals Q and $\overline{Q}$ which pass through the corresponding AND gates 12 and 13 are supplied to the inverting input terminals of the corresponding OR gates 14 and 15. Hence, the signals Q and $\overline{Q}$ are inverted and supplied to the D flip-flop 10 as signals Q and $\overline{Q}$. Therefore, in this case, the logic circuit shown in FIG. 10 becomes equivalent to a T flip-flop 21 shown in FIG. 12A and operates as a T flip-flop.

Figure 11:
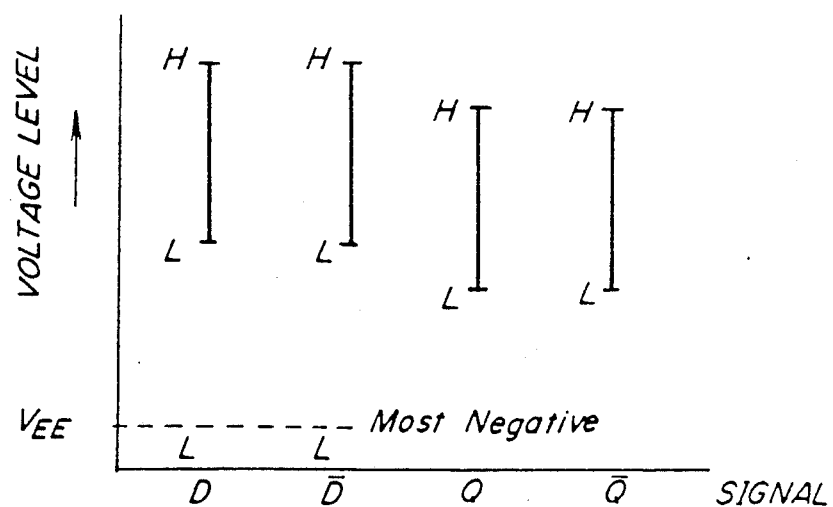
FIG. 11 is a diagram showing relationships of signal levels at various parts of the logic circuit shown in FIG. 10.
Figure 12B:
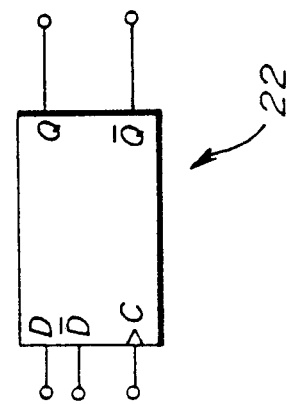
FIG. 12B is a block diagram showing a D flip-flop which is realized by the first embodiment.

On the other hand, when the input data terminals D and $\overline{D}$ are not open-circuited and the input data signals D and $\overline{D}$ are applied to the NOR gate 11 with the binary level shown in FIG. 11, the NOR gate 11 outputs a low-level signal and the AND gates 12 and 13 are closed. Thus, unlike the case described above, the output signals Q and $\overline{Q}$ will not be fed back from the D flip-flop 10 and the input data signals D and $\overline{D}$ are supplied to the D flip-flop 10 via the corresponding OR gates 14 and 15. In this case, the logic circuit shown in FIG. 10 becomes equivalent to a D flip-flop 22 shown in FIG. 12B and operates as a D flip-flop.

Therefore, by adding a simple circuit to a flip-flop and adjusting the relationship of the levels of the input data signals D and $\overline{D}$ and the output signals Q and $\overline{Q}$, it is possible to realize a circuit which can selectively function as a T flip-flop and a D flip-flop. This means that the integration density and functions of the logic circuit can be improved, and it is possible to satisfy the user's various demands and to reduce the cost of the logic circuit.

Figure 2A:
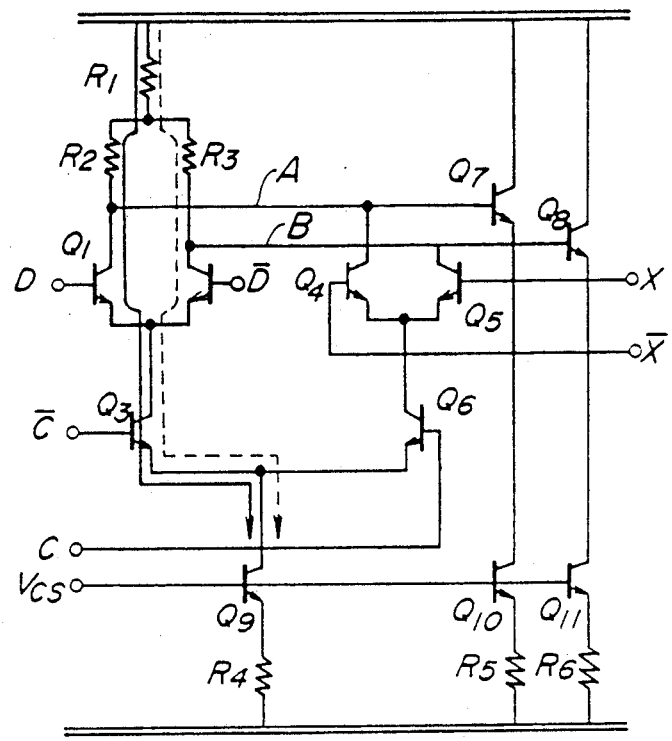
FIGS. 2A and 2B respectively are circuit diagrams for explaining an operation of the D flip-flop shown in FIG. 1.
Figure 2B:
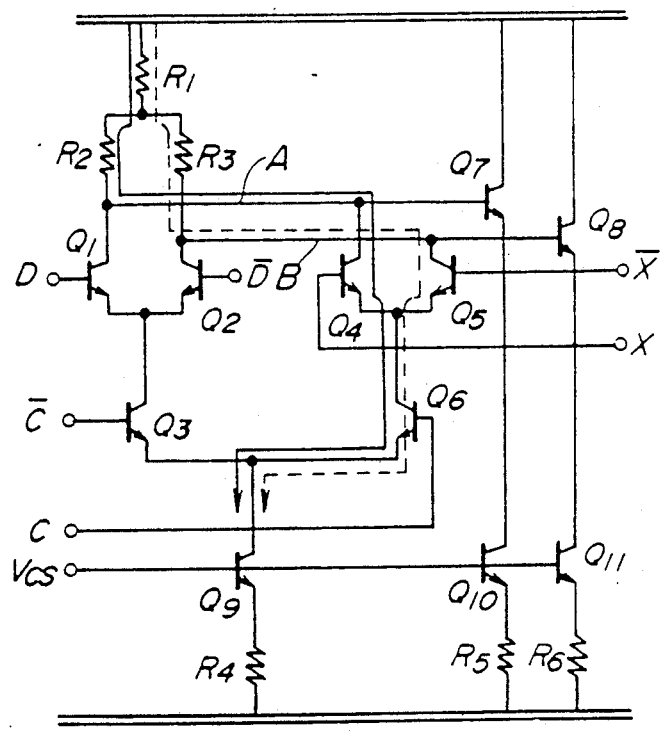
Figure 5A:
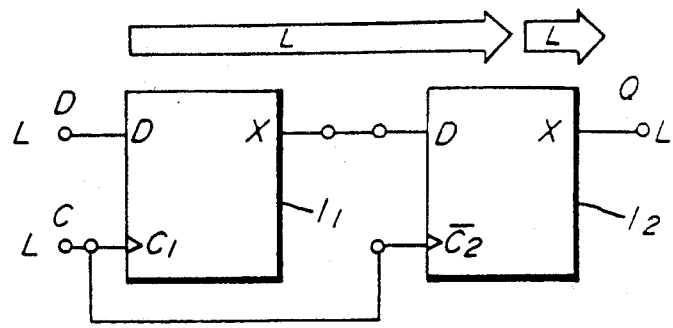
FIGS. 5A through 5E are diagrams for explaining data flows at various time intervals shown in FIGS. 4(A) through 4(C)
Figure 5B:
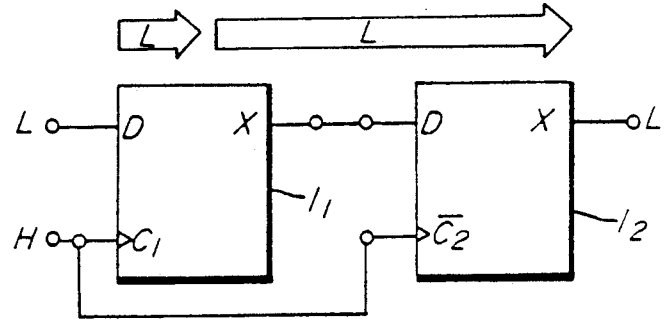
Figure 5C:
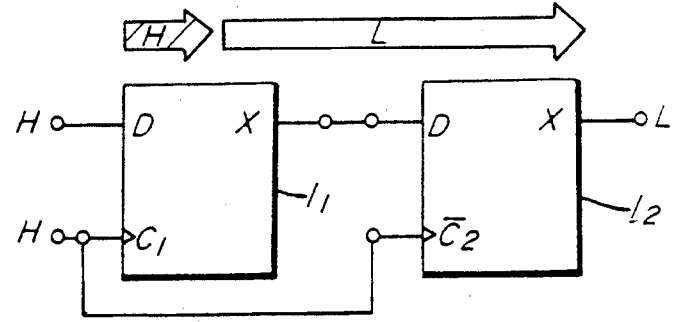
Figure 5D:
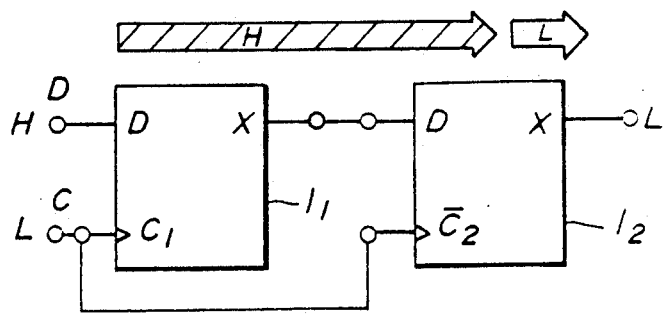
Figure 5E:
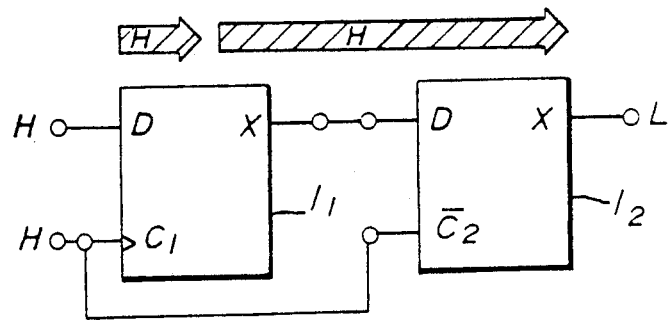
Figure 6:
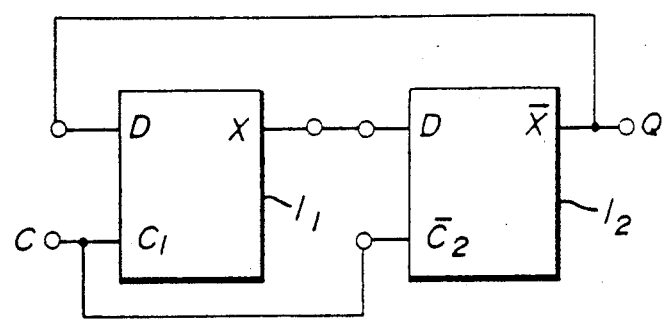
FIG. 6 is a block diagram showing two latch circuits constituting a conventional T flip-flop.
Figure 8:
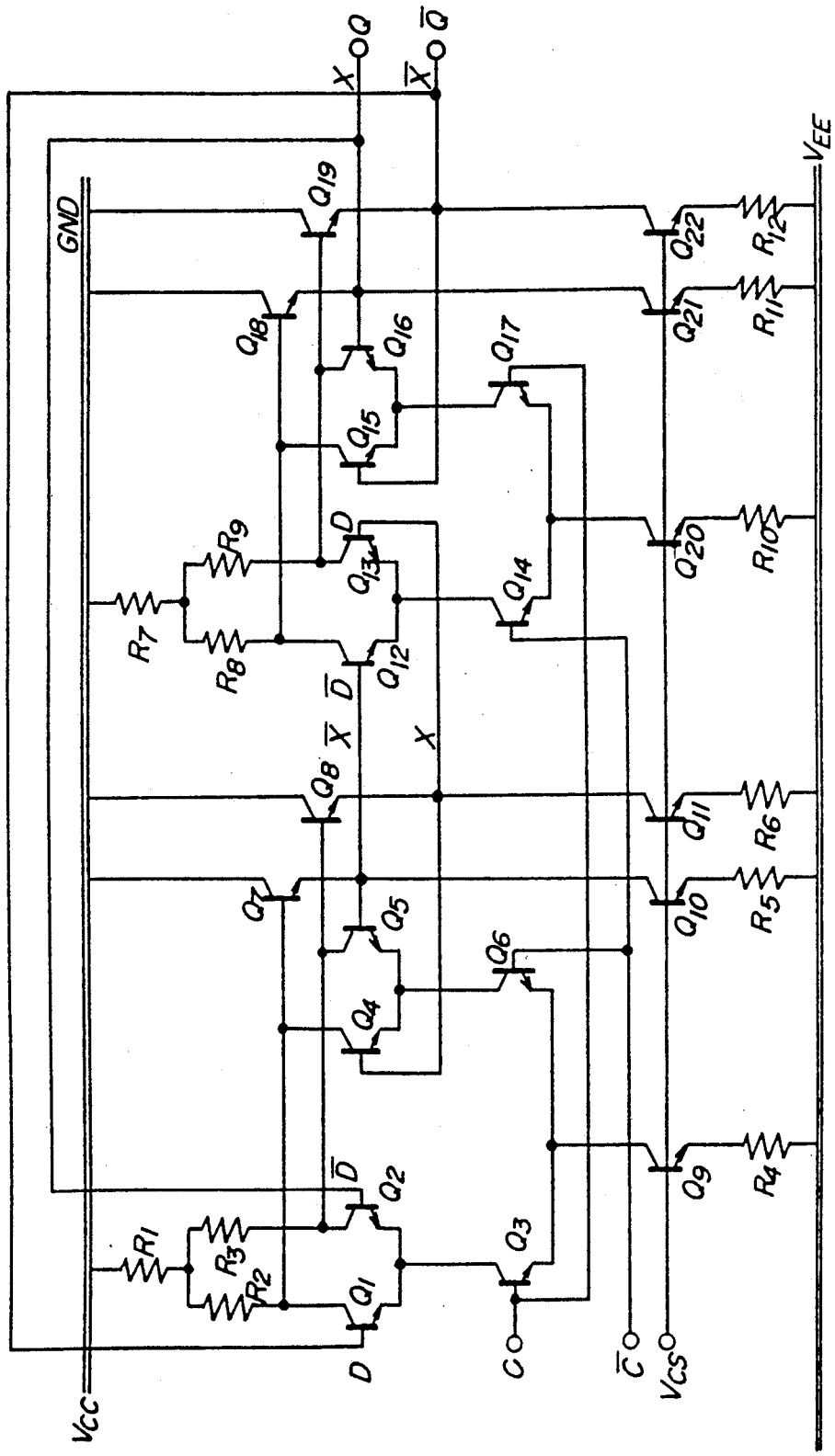
FIG. 8 is a circuit diagram showing the T flip-flop.
Figure 9A:
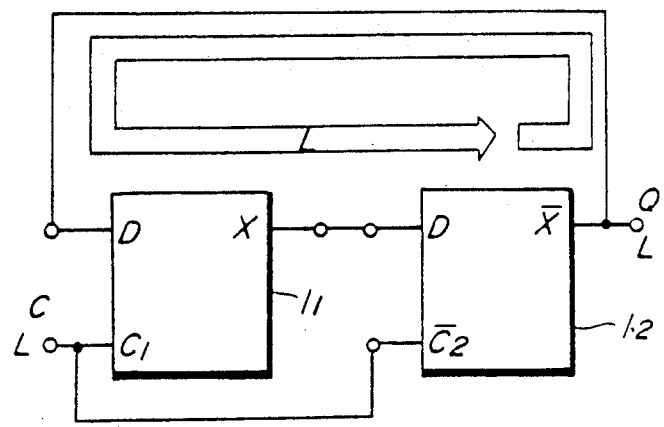
FIGS. 9A through 9D are diagrams for explaining data flows at various time intervals shown in FIGS. 7(A) through 7(B)
Figure 9B:
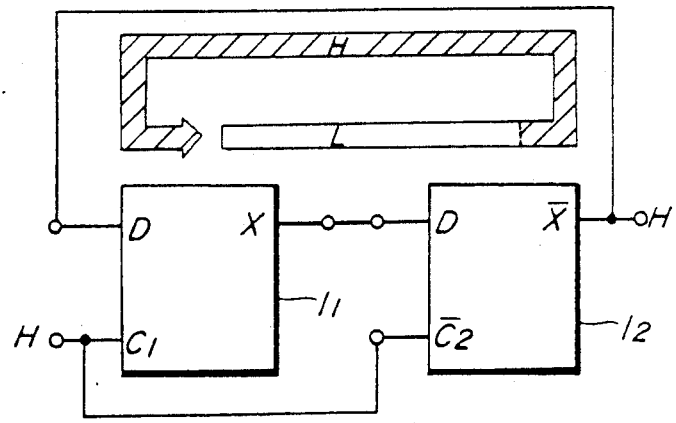
Figure 9C:
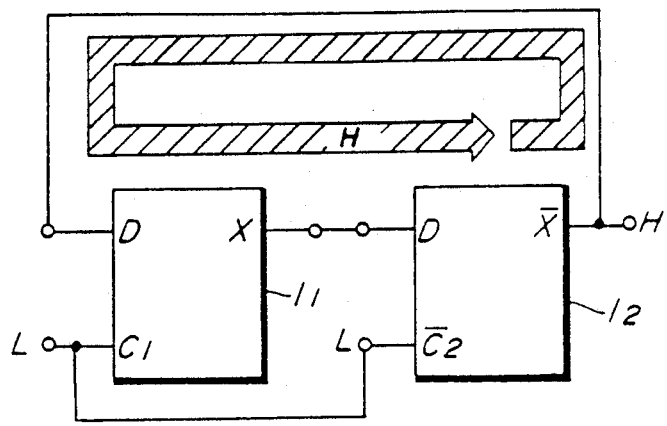
Figure 9D:
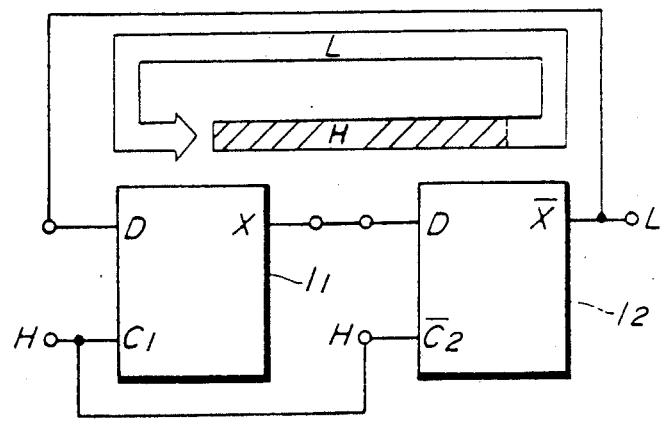

Next, a more detailed description will be given of the first embodiment, by referring to FIGS. 13, 14(A), 14(B) and 15(A) through 15(C). FIG. 13 shows a circuit diagram of the first embodiment. In FIG. 13, those parts which are essentially the same as those corresponding parts in FIG. 8 are designated by the same reference numerals, and a description thereof will be omitted.

In FIG. 13, a circuit part 30 indicated by a phantom line constitutes an essential part of this embodiment. The circuit part 30 comprises transistors Q31 through Q34 and resistors R21 through R23. Collectors of the transistors Q31 and Q32 are connected, and emitters of the transistors Q31 and Q32 are connected. The input data signal D is applied to a base of the transistor Q31, and a feedback output signal $\overline{Q}$ is applied to a base of the transistor Q32. Similarly, collectors of the transistors Q33 and Q34 are connected, and emitters of the transistors Q33 and Q33 are connected. The input data signal $\overline{D}$ is applied to a base of the transistor Q34, and a feedback output signal Q is applied to a base of the transistor Q33.

The resistors R24 and R25 which are respectively connected to the bases of the transistors Q31 and Q34 also constitute another essential part of this embodiment. The resistors R24 and R25 function as pull-down resistors. When no input data signal D is applied to the base of the transistor Q31, the pull-down resistor R24 pulls down the base potential to the same potential as the power source voltage $V_{EE}$ which is $-5.2$ V, for example. Similarly, when no input data signal $\overline{D}$ is applied to the base of the transistor Q34, the pull-down resistor R25 pulls down the base potential to the same potential as the power source voltage $V_{EE}$. A power source voltage of $V_{CC}=0$ V=GND is used in this embodiment. The relationship of the levels of the input data signals D and $\overline{D}$ and the output signals Q and $\overline{Q}$ are set as shown in FIG. 11. The remaining part of the circuit shown in FIG. 13 is the same as the corresponding part of the circuit shown in FIG. 8.

The circuit part 30 and the pull-down resistors R24 and R25 as a whole constitutes a function selection means 31 which corresponds to the function selection means 16 shown in FIG. 10. Of course, the circuit shown in FIG. 13 corresponds to two latch circuits which are connected in series. A left circuit portion corresponds to a latch circuit 32, and a right circuit portion corresponds to a latch circuit 33.

When the input data terminals D and $\overline{D}$ are open-circuited in FIG. 13, that is, $D=\overline{D}=L$ (most negative level), the base potentials of the transistors Q31 and Q34 are maintained to the same potential as the power source voltage $V_{EE}$ by the respective pull-down resistors R24 and R25. In this state, the transistors Q31 and Q34 are turned OFF. Accordingly, the output signals Q and $\overline{Q}$ are fed back and applied to the bases of the respective transistors Q33 and Q32. Therefore, the circuit shown in FIG. 13 becomes equivalent to the T flip-flop 21 shown in FIG. 12A and operates as a T flip-flop. FIGS. 14(A) and 14(B) show timings of the clock signal C and the output signal Q for this case.

On the other hand, when the input data terminals D and $\overline{D}$ are not open-circuited and the input data signals D and $\overline{D}$ are applied to the circuit part 30 with the binary level shown in FIG. 11, a signal having a level higher than the high level of the output signals Q and $\overline{Q}$ is constantly applied to one of the transistors Q31 and Q34. In the case of the ECL gates, the gate (transistor) which receives the input signal with the higher level turns ON. Thus, unlike the case described above, the output signals Q and $\overline{Q}$ (feedback signals) have no effect to the elements within the circuit part 30. In this case, the circuit shown in FIG. 13 becomes equivalent to the D flip-flop 22 shown in FIG. 12B and operates as a D flip-flop. FIGS. 15(A) through 15(C) respectively show timings of the clock signal C, the data input signal D and the output signal Q for this case.

This first embodiment also has the following advantageous feature. That is, when testing to determine whether or not the flip-flop within the logic circuit operates correctly, the circuit shown in FIG. 13 is set to operate as the T flip-flop. Hence, it is possible to test the operation of the flip-flop by simply applying the clock signal C to the circuit. This easy and simple testing capability is advantageous especially when a large number of D flip-flops and T flip-flops coexist within the logic circuit, because there is no need to select only the D flip-flops and test the D flip-flops by applying input data signals.

Next, a description will be given of a second embodiment of the logic circuit according to the present invention. In the first embodiment, the logic circuit is switched to operate either as a T flip-flop or a D flip-flop depending on whether or not the input data signals are applied to the logic circuit. But in the second embodiment, a signal for switching the logic circuit to operate either as a T flip-flop or a D flip-flop is generated within the logic circuit.

Figure 16:
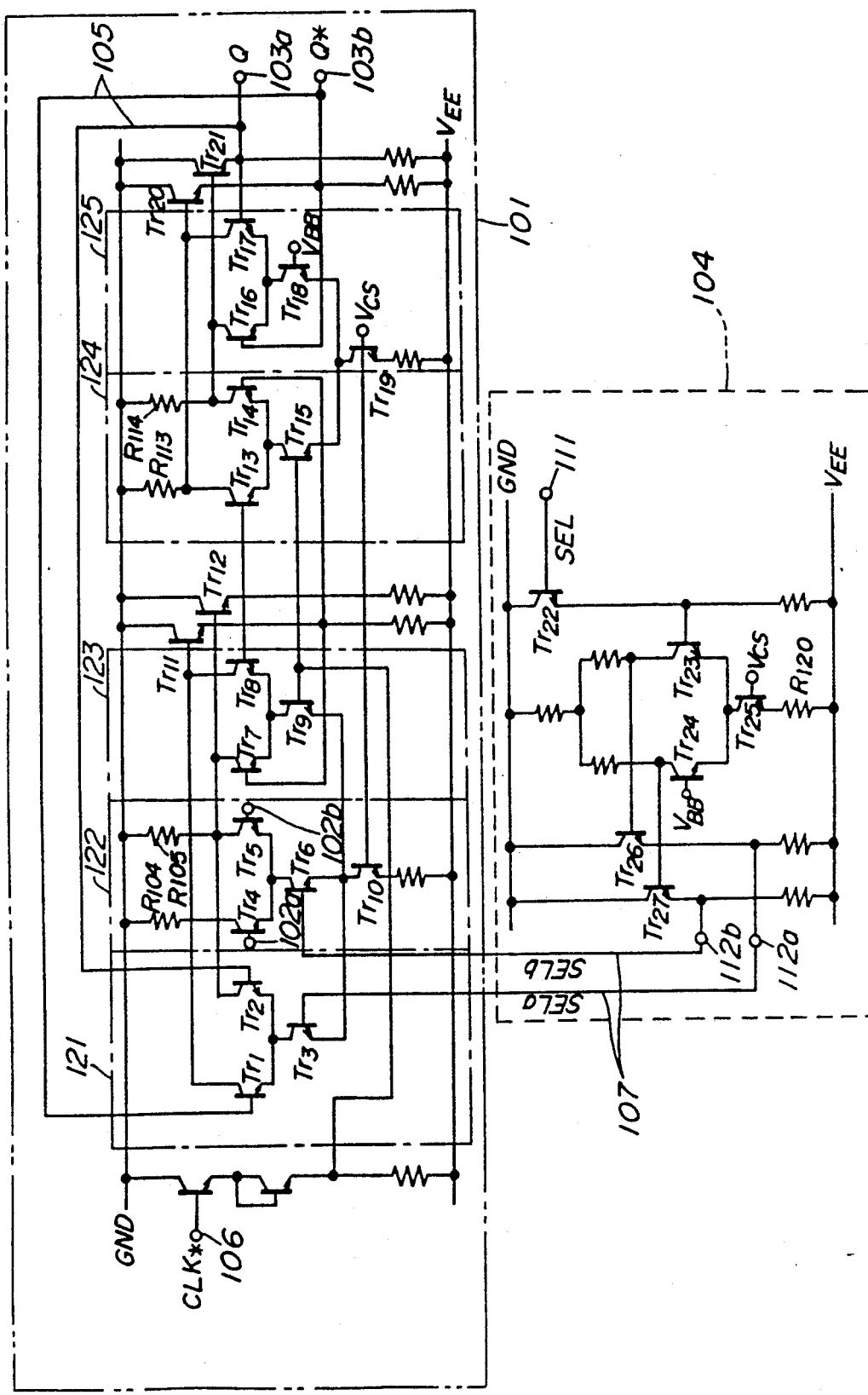
FIG. 16 is a circuit diagram showing a second embodiment of a logic circuit according to the present invention.

FIG. 16 shows the second embodiment of the logic circuit. First a brief description will be given of this second embodiment. The logic circuit comprises a flip-flop part 101, external input data terminals 102a and 102b, output terminals 103a and 103b, feedback lines 105, a clock input terminal 106, a selection signal lines 107, and a selection signal control part 104. A latch circuit of a first stage is made up of first, second and third function blocks 121, 122 and 123. The first function block 121 constitutes a first data input part, and the second function block 122 constitutes a second data input part. A latch circuit of a latter stage is made up of fourth and fifth function blocks 124 and 125.

The first data input part 121 comprises transistors Tr1 through Tr3. The transistors Tr1 and Tr2 have emitters which are connected and bases which are respectively connected to the output terminals 103b and 103a of the latch circuit of the latter stage. The transistor Tr3 has a collector which is connected to emitters of the transistors Tr1 and Tr2.

The second data input part 122 comprises transistors Tr4 through Tr6 and Tr10. The transistors Tr4 and Tr5 have emitters which are connected and bases which are respectively connected to the external input data terminals 102a and 102b. The transistor Tr6 has a collector which is connected to emitters of the transistors Tr4 and Tr5, and an emitter which is connected to the emitter of the transistor Tr3.

The selection signal lines 107 (SELa and SELb) are respectively connected to the bases of the transistors Tr3 and Tr6. One of the first and second data input parts 121 and 122 is operated in response to selection signals SELa and SELb which are obtained from the selection signal lines 107. Accordingly, when the selection signal SELa selects the first data input part 121, the data signals are input from the feedback lines 105 and the circuit operates as a T flip-flop. On the other hand, when the selection signal SELb selects the second data input part 122, the data signals are input from the external input data terminals 102a and 102b and the circuit operates as a D flip-flop.

Next, a more detailed description will be given of the second embodiment. The circuit shown in FIG. 16 employs the ECL and the power source voltages $V_{EE}$ and GND and the constant voltages $V_{BB}$ and $V_{CS}$ are set so that a relation $GND > V_{BB} > V_{CS} > V_{EE}$ holds. The selection signals SELa and SELb select which one of the first and second data input parts 121 and 122 is to operate, so as to determine whether the circuit is to operate as the T flip-flop or the D flip-flop. The selection signal control part 104 controls the selection signals SELa and SELb so that the circuit can be freely switched at any time to operate as the T flip-flop or the D flip-flop.

A description will now be given of the selection signal control part 104. When a select signal SEL having a high or low level is applied to a select signal input terminal 111, the selection signal control part 104 supplies selection signals SELa and SELb of mutually opposite levels (high and low levels or vice versa) to the selection signal output terminals 112a and 112b.

When a high-level select signal SEL is applied to the select signal input terminal 111, an emitter voltage of the transistor Tr22 rises and a voltage which is higher than the base voltage $V_{BB}$ of the transistor Tr24 is applied to the transistor Tr23. As a result, the transistor Tr24 turns OFF and the transistor Tr23 turns ON. Accordingly, a current flows from the ground GND to the transistors Tr25 and Tr23 via a resistor R120, and a low-level selection signal SELa is output from the selection signal output terminal 112a. On the other hand, a high-level selection signal SELb is output from the selection signal output terminal 112b because the transistor Tr24 turns OFF and the base voltage of the transistor Tr27 rises. In this case, the function of the D flip-flop is selected.

When a low-level select signal SEL is applied to the select signal input terminal 111, a high-level selection signal SELa is output from the selection signal output terminal 112a and a low-level selection signal SELb is output from the selection signal output terminal 112b. In this case, the function of the T flip-flop is selected.

Next, a description will be given of the flip-flop part 101. The flip-flop part 101 comprises the first through fifth function blocks 121 through 125 as described above, and each function block comprises two transistors which have emitters thereof connected and a transistor which has a collector connected to the emitters of the two transistors. The first through third function blocks 121 through 123 constitute a latch circuit of a first stage, and the fourth and fifth function blocks 124 and 125 constitute a latch circuit of a latter stage. In the latch circuit of the first stage, the feedback lines 105 are connected to bases of the transistors Tr1 and Tr2 which are within the first function block 121 and have emitters thereof connected. In addition, the external input data terminals 102a and 102b are connected to bases of the transistors Tr4 and Tr5 which are within the second function block 122. Data signals of mutually opposite levels are applied to the two feedback lines 105. Furthermore, data signals of mutually opposite levels are applied to the external input data terminals 102a and 102b.

A clock signal CLK* is applied to the clock input terminal 106 of the flip-flop part 101. This clock signal CLK* is supplied to a base of a transistor Tr9 within the third function block 123 and a base of a transistor Tr15 within the fourth function block 124. A high level of the clock signal CLK* is higher than the voltage $V_{BB}$, and a low level of the clock signal CLK* is lower than the voltage $V_{BB}$.

The selection signal lines 107 which connect to the selection signal output terminals 112a and 112b of the selection signal control part 104 also connect to a base of the transistor Tr6 within the second function block 122 and a base of the transistor Tr3 within the first function block 121. The high level of the selection signals SELa and SELb is set to an intermediate level between the high and low levels of the clock signal CLK*. The low level of the selection signals SELa and SELb is set lower than the low level of the clock signal CLK*. FIG. 17 shows the binary level range of the clock signal CLK* and the selection signals SELa and SELb.

Next, a description will be given of a case where the circuit shown in FIG. 16 is used as a D flip-flop, by referring to FIGS. 18(A) through 18(C). FIG. 18 (A) shows the clock signal CLK*, FIG. 18(B) shows the input data signal D applied to the external input data terminal 102a, and FIG. 18(C) shows the output data signal Q which is output from the output terminal 103a.

When the high-level select signal SEL is applied to the select signal input terminal 111 of the selection signal control part 104, the selection signals SELa and SELb which are output from the selection signal output terminals 112a and 112b respectively have a low level and a high level. The transistor Tr3 is turns OFF responsive to the low-level selection signal SELa. Although the high-level selection signal SELb is applied to the base of the transistor Tr6, the transistor Tr9 turns ON and the transistor Tr6 turns OFF when the high-level clock signal CLK* is applied to the base of the transistor Tr9, due to the binary level range of the signals SELb and CLK* described above in conjunction with FIG. 17. On the other hand, when the low-level clock signal CLK* is applied to the base of the transistor Tr9, the transistor Tr9 turns OFF and the transistor Tr6 turns ON responsive to the high-level selection signal SELb.

First, it is assumed that a high-level data signal is applied to the external input data terminal 102a and a low-level data signal is applied to the external input data terminal 102b at a time immediately before a time t0. The clock signal CLK* has a high level at the time immediately before the time t0.

When the clock signal CLK* undergoes a transition from the high level to the low level at the time t0, the transistor Tr9 turns OFF and the transistor Tr6 turns ON, and the second function block 122 is operated. High and low level data signals are respectively applied to the external input data terminals 102a and 102b, and the transistor Tr4 turns ON and the transistor Tr5 turns OFF. As a result, a current flows from the ground GND to the power source $V_{EE}$ via the resistor R104 and the transistor Tr4, and a low-level signal is applied to a base of the transistor Tr11 which is connected to a collector of the transistor Tr4 and a low-level signal is applied to a base of the transistor Tr7. On the other hand, a base voltage of the transistor Tr12 is high and a high-level signal is applied to a base of the transistor Tr8. In other words, the input data signals are input to the transistors Tr4 and Tr5.

Next, when the clock signal CLK* undergoes a transition from the low level to the high level at a time t1, the transistor Tr6 turns OFF and the transistor Tr9 turns ON, and the third function block 123 is operated. The transistor Tr7 turns OFF and the transistor Tr8 turns ON due to the data signals which are applied to the bases of the transistors Tr7 and Tr8 at the time t0, and the input data signals are latched. In other words, the input data signals are latched by a master flip-flop which is made up of the second and third function blocks 122 and 123 and the transistors Tr11 and Tr12. In this state, there is no input from the external input terminals 102a and 102b because the transistor Tr6 is OFF.

At the same time, the transistor Tr15 turns ON and the fourth function block 124 is operated. Hence, the high and low level signals from the collectors of the transistors Tr7 and Tr8 within the third function block 123 are respectively applied to bases of the transistors Tr13 and Tr14 within the fourth function block 124, and high and low level signals are respectively output from the output terminals 103a and 103b. That is, output data signals Q and Q* which are dependent on the input data signals are respectively output from the output terminals 103a and 103b responsive to the rising edge of the clock signal CLK*.

When the clock signal CLK* undergoes a transition from the high level to the low level at a time t2, the transistor Tr15 turns OFF and the transistor Tr18 turns ON, and the fifth function block 125 is operated. The transistors Tr16 and Tr17 of the fifth function block 125 latch the data signals from the third function block 123 which have low and high levels, respectively. In other words, the input data signals are latched and the outputs are held by a slave flip-flop which is made up of the fourth and fifth function blocks 124 and 125 and the transistors Tr16 and Tr17.

At the same time, the transistor Tr6 also turns ON, and the second function block 122 operates to assume the input state. Thus, the transistors Tr4 and Tr5 respectively input the new data signals which respectively have low and high levels from the external input data terminals 102a and 102b.

From a time t3 and thereafter, the operation carried out between the times t1 and t3 are repeated. In other words, the data signals are output when the clock signal CLK* undergoes the transition from the low level to the high level, and the data signals thereafter are held until the same clock transition occurs. Therefore, the circuit shown in FIG. 16 operates as a D flip-flop.

Next, a description will be given of a case where the circuit shown in FIG. 16 is used as a T flip-flop, by referring to FIGS. 19(A) and 19(B). FIG. 19(A) shows the clock signal CLK*, FIG. 19(B) shows the output data signal Q which is output from the output terminal 102a.

In this case, a low-level select signal SEL is applied to the select signal input terminal 111 of the selection signal control circuit 104. A high-level selection signal SELa and a low-level selection signal SELb are respectively output from the selection signal output terminals 112a and 112b, and the transistor Tr6 turns OFF. The transistor Tr3 operates due to the level comparison of the base voltage of the transistor Tr3 and the base voltage of the transistor Tr9.

First, it is assumed that a high-level signal is applied to the base of the transistor Tr1 via the feedback line 105 and a low-level signal is applied to the base of the transistor Tr2 via the feedback line 105 at a time immediately before a time t0. The clock signal CLK* has a high level at the time immediately before the time t0.

When the clock signal CLK* undergoes a transition from the high level to the low level at the time t0, the transistor Tr9 turns OFF and the transistor Tr3 turns ON, and the first function block 121 is operated. In this case, high and low level signals are respectively input from the bases of the transistors Tr1 and Tr2. Hence, the base of the transistor Tr11 which is connected to the collector of the transistor Tr1 is set to the low level, and the base of the transistor Tr7 is also set to the low level. On the other hand, the base of the transistor Tr12 is set to the high level and the base of the transistor Tr8 is set to the high level. In other words, the output data signals Q and Q* are respectively fed back to the transistors Tr1 and Tr2 via the feedback lines 105 as the input data signals.

Then, when the clock signal CLK* undergoes a transition from the low level to the high level at a time t1, the transistor Tr3 turns OFF and the transistor Tr9 turns ON, and the third function block 123 is operated. The transistor Tr7 turns OFF and the transistor Tr8 turns ON to latch the input data signal due to the low and high level signals which are respectively applied to the bases of the transistors Tr7 and Tr8 at the time t0. That is, the input data signals are latched by a master flip-flop which is made up of the first and third function blocks 121 and 123 and the transistors Tr11 and Tr12. In this state, the transistors Tr1 and Tr2 do not operate because the transistor Tr3 is OFF.

At the same time, the transistor Tr15 also turns ON and the fourth function block 124 is operated. Hence, the high and low level signals from the collectors of the transistors Tr7 and Tr8 are respectively applied to the bases of the transistors Tr13 and Tr14, and high and low level signals are respectively output from the output terminals 103a and 103b. In other words, the output data signals Q and Q* which are dependent on the input data signals are respectively output from the output terminals 103a and 103b responsive to the rising edge of the clock signal CLK*.

The output data signals Q and Q* which respectively have the high and low levels in this case are applied to the bases of the transistors Tr2 and Tr1 via the feedback lines 105 as new data input signals.

When the clock signal CLK* again undergoes a transition from the high level to the low level at a time t2, the transistor Tr15 turns OFF and the transistor Tr18 turns ON, and the fifth function block 125 is operated. The transistors Tr16 and Tr17 of the fifth function block 125 latch the data signals from the third function block 123 which have low and high levels, respectively. In other words, the input data signals are latched and the outputs are held by a slave flip-flop which is made up of the fourth and fifth function blocks 124 and 125 and the transistors Tr16 and Tr17.

At the same time, the transistor Tr3 also turns ON, and the first function block 121 operates to input the low and high level data signal which are fed back to the transistors Tr1 and Tr2. Thus, the transistor Tr11 turns ON, the transistor Tr12 turns OFF, and high and low level signals are respectively applied to the bases to the transistors Tr7 and Tr8.

When the clock signal CLK* undergoes a transition from the low level to the high level at a time t3, the transistor Tr9 turns ON and the third function block 123 is operated. The transistor Tr7 turns ON, the transistor Tr8 turns OFF, and the input data signals are latched. In other words, the input data signals are latched by the master flip-flop.

At the same time, the transistor Tr15 also turns ON and the fourth function block 124 is operated. The high and low level signals from the collectors of the transistors Tr7 and Tr8 are respectively applied to the bases of the transistors Tr14 and Tr13, and low and high level output data signals Q and Q* are respectively output from the output terminals 103a and 103b. That is, the output data signals Q and Q* which are dependent on the new input data signals which are fed back are respectively output from the output terminals 103a and 103b responsive to the rising edge of the clock signal CLK*.

In addition, the output data signals Q and Q* are fed back to the bases of the transistors Tr2 and Tr1 of the first function block 121 via the feedback lines 105, as input data signals.

From a time t4 and thereafter, the operation carried out between the times t0 and t4 are repeated. In other words, the output data signals Q and Q* are inverted for every one period of the clock signal CLK*. Therefore, the circuit shown in FIG. 16 operates as a T flip-flop.

According to this embodiment, the selection signal control part 104 is added to the flip-flop part 101. The first function block 121 which is connected to the feedback lines 105 or the second function block 122 which has the external input data terminals 102a and 102b is selected depending on the level of the select signal SEL. The select signal SEL is applied to the select signal input terminal 111 of the selection signal control part 104, so as to selectively use the circuit as a D flip-flop or a T flip-flop depending on the needs. Accordingly, when producing a logic circuit in which D flip-flops and T flip-flops coexist, the D flip-flops and the T flip-flops can be arranged with a desired arrangement by simply applying a high or low level select signal SEL to the select signal input terminal 111 of the selection signal control part 104.

Furthermore, because the circuit shown in FIG. 16 can be freely switched at an arbitrary time to operate as the D flip-flop or the T flip-flop, it is easy to test the operation of the flip-flop circuit within the logic circuit. That is, when testing to determine whether or not the flip-flop within the logic circuit operates correctly, the circuit shown in FIG. 16 is set to operate as the T flip-flop. Hence, it is possible to test the operation of the flip-flop by simply applying the clock signal C to the circuit. This easy and simple testing capability is advantageous especially when a large number of D flip-flops and T flip-flops coexist within the logic circuit, because there is no need to select only the D flip-flops and test the D flip-flops by applying input data signals.

In this embodiment, it is possible to produce the logic circuit in the following manner. That is, a number of flip-flop parts 101 is first formed on an integrated circuit, without the selection signal control parts 104. Then, depending on the desired arrangement of the D flip-flops and T flip-flops, the voltages applied to the selection signal output terminals 112a and 112b are fixed. For example, the voltages applied to the selection signal output terminals 112a and 112b are respectively fixed to the low and high levels when the D flip-flop function is desired, and the voltages applied to the selection signal output terminals 112a and 112b are respectively fixed to the high and low levels when the T flip-flop function is desired. In this case, it is not possible to freely switch the flip-flop to operate as the D flip-flop and the T flip-flop. However, the required circuit area can be reduced because there is no need to provide the selection signal control parts 104 and there is no need to constantly apply the voltages to the select signal input terminal 111.

When a programming means such as a fuse and a erasable programmable read only memory (EPROM) is used to fix the voltages applied to the selection signal output terminals 112a and 112b, the D flip-flop function and the T flip-flop function can be selected freely at the time the logic circuit is produced and also by the user after the production.

The embodiments described heretofore use the ECL. However, the present invention is not limited to the logic circuits employing the ECL. The present invention is applicable to all logic circuits which use threshold values, such as a logic circuit which employs a source coupled field effect transistor logic (SCFL) which is an application of the ECL to a gallium arsenide (GaAs) FET.

Further, the present invention is not limited to these embodiments, but various variations and modifications may be made without departing from the scope of the present invention.

What is claimed is:

1. A logic circuit having first and second modes, and comprising:
    first terminal means for receiving an open-circuited signal which designates the first mode and an input data signal which designates the second mode;
    second terminal means for receiving a clock signal;
    first latch means coupled to said first and said second terminal means for latching and for providing as a first output signal in response to the clock signal, the input data signal;
    second latch means coupled to said first latch means for latching, and for providing as a second output signal, the first output signal;
    third terminal means for outputting the second output signal; and
    selecting means, coupled to said third terminal means, for selectively feeding back the second output signal to said first latch means responsive to said first terminal means receiving one of the open-circuited signal and the input data signal such that the logic circuit functions as a toggle flip-flop in the first mode and functions as a delay flip-flop in the second mode, without requiring a change in physical wiring.

2. The logic circuit as claimed in claim 1, wherein said selecting means comprises feed-back means for feeding back the second output signal to said first latch means when said first terminal means receives the open-circuited signal and for blocking the second output signal from said first latch means when said first terminal means receives the input data signal.

3. The logic circuit as claimed in claim 2, wherein said first latch means includes means for receiving the input data signal having first and second voltage levels, and wherein said second latch means includes means for outputting the second output data signal having a third voltage level set between said first and second voltage levels, and a fourth voltage level set lower than said second voltage level.

4. The logic circuit as claimed in claim 2, further comprising:
    test means for blocking said first terminal means from receiving the input data signal, and for permitting said second terminal means to receive the clock signal in said first mode.

5. The logic circuit as claimed in claim 1, wherein said first latch means includes means for receiving a first select signal having a first and second logic level, and wherein
    said selecting means comprises feed-back means for feeding back the second output signal to said first latch means when the select signal has the first logic level and for blocking the second output signal from said first latch means when the select signal has the second logic level.

6. The logic circuit as claimed in claim 5 wherein said selecting means comprises a first data input part which comprises first, second and third transistors, a second data input part which comprises fourth, fifth and sixth transistors, and a selection signal control part, said first and second transistors having emitters which are connected in common and bases which are coupled to said output terminal means, said third transistor having a collector which is connected to the emitters of said first and second transistors, said fourth and fifth transistors having emitters which are connected in common, at least one of said fourth and fifth transistors having a base which is coupled to said first terminal means, said sixth transistor having a collector which is connected to the emitters of said fourth and fifth transistors and an emitter which is connected to the emitter of said third transistor, said selection signal control part outputs a selection signal which is supplied to a base of at least one of said third and sixth transistors in response to the select signal, so that one of said first and second data input parts is operated.

7. The logic circuit as claimed in claim 6, further comprising:
    means for receiving the clock signal having first and second voltage levels, and wherein said selecting means includes means for receiving a second select signal having a third voltage level set between said first and second voltage levels, and a fourth voltage level set lower than said second voltage level.

8. The logic circuit as claimed in claim 5, further comprising:
   test means for blocking said first terminal means from receiving the input data signal, and for permitting said second terminal means to receive the clock signal in said first mode.

9. A logic circuit having first and second modes, and comprising:
   first terminal means for receiving an open-circuited signal which designates the first mode and an input data signal which designates the second mode;
   second terminal means for receiving a clock signal;
   first latch means coupled to said first and said second terminal means for latching, and for providing as a first output signal in response to the clock signal, the input data signal;
   second latch means coupled to said first latch means for latching, and for providing as a second output signal, the first output signal;
   third terminal means for outputting the second output signal; and
   selecting means, coupled to said third terminal means, for selectively feeding back the second output signal to said first latch means responsive to said first terminal means receiving one of the open-circuited signal and the input data signal.

* * * * *

UNITED STATES PATENT AND TRADEMARK OFFICE
CERTIFICATE OF CORRECTION

PATENT NO. : 5,027,005
DATED : June 25, 1991
INVENTOR(S) : Kitsuta et al.

It is certified that error appears in the above-identified patent and that said Letters Patent is hereby corrected as shown below:

Title Page [73] Assignee, after

"Japan" insert the second Assignee

--Fujitsu VLSI Limited, Kasugai, Japan.

Col. 5, line 34, change "Q and Q" to

--Q and $\overline{Q}$--.

Signed and Sealed this

Twenty-seventh Day of October, 1992

Attest:

DOUGLAS B. COMER

*Attesting Officer*    *Acting Commissioner of Patents and Trademarks*